United States Patent
Huang et al.

[11] Patent Number: 5,874,355
[45] Date of Patent: Feb. 23, 1999

[54] METHOD TO PREVENT VOLCANE EFFECT IN TUNGSTEN PLUG DEPOSITION

[75] Inventors: Ji-Chung Huang; Je Wang; Ying-Shih Huang, all of Hsin-Chu, Taiwan

[73] Assignee: Taiwan Semiconductor Manufacturing Company, Ltd, Hsin-Chu, Taiwan

[21] Appl. No.: 873,829

[22] Filed: Jun. 12, 1997

Related U.S. Application Data

[63] Continuation of Ser. No. 579,512, Dec. 27, 1995, abandoned.

[51] Int. Cl.$^6$ .................................................. H01L 21/283
[52] U.S. Cl. ........................ 438/627; 438/643; 438/648; 438/798
[58] Field of Search .................................... 438/627, 628, 438/629, 643, 644, 648, 658, 659, 798

[56] References Cited

U.S. PATENT DOCUMENTS

| | | | |
|---|---|---|---|
| 4,960,732 | 10/1990 | Dixit et al. | 437/192 |
| 5,093,710 | 3/1992 | Higuchi . | |
| 5,232,871 | 8/1993 | Ho | 437/190 |
| 5,591,672 | 1/1997 | Lee et al. . | |

OTHER PUBLICATIONS

Wolf, S., Silicon Processing, vol. 2, 1992 Lattice Press, pp. 240–252.
"Silicon Processing for the VLSI Era" by S. Wolf, Lattice Press, Sunset Beach, California, 1990, vol. 2 p. 213.

*Primary Examiner*—T. N. Quach
*Attorney, Agent, or Firm*—George O. Saile; Stephen B. Ackerman

[57] ABSTRACT

A method to prevent volcano effect in tungsten plug deposition is described. The method is applied to both the contact plugs as well as the via plugs. For these purposes, the use of a nitrogen ($N_2$) plasma of a specific recipe is introduced. It is shown that the presence of the nitrogen plasma improves the titanium nitride (TiN) barrier layer through annealing, and nitrogen stuffing of the grain boundaries. In addition, a titanium (Ti) layer must be used prior to the deposition of the TiN layer in order to improve adhesion. This step also enhances the titanium nitride barrier, and reduces the contact resistance ($R_c$) of the contact-plugs as well. Finally, the nitrogen plasma process and the metal deposition can be done in one and the same equipment.

6 Claims, 3 Drawing Sheets

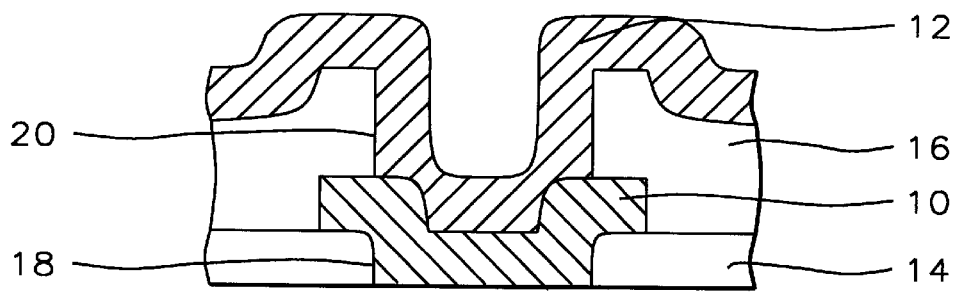
FIG. 1a – Prior Art
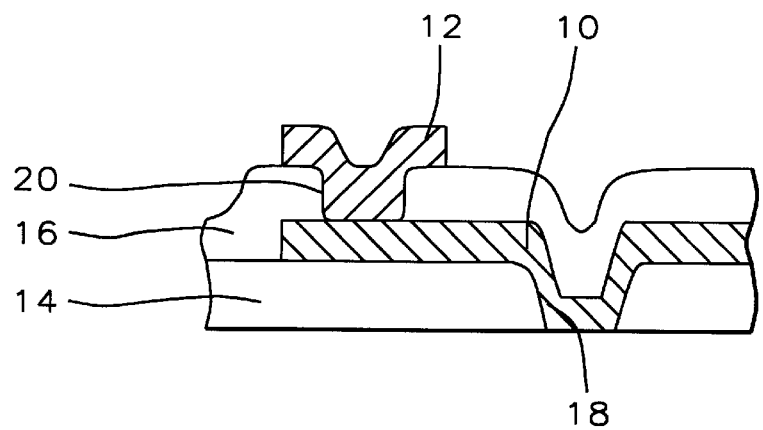
FIG. 1b – Prior Art
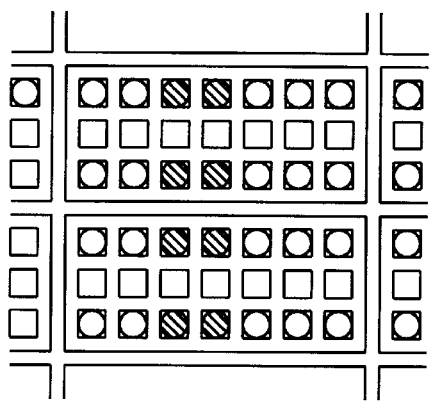
FIG. 2A – Prior Art
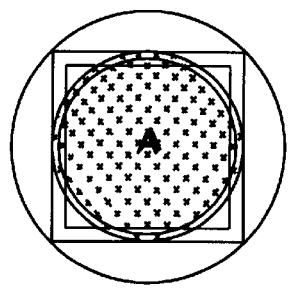
FIG. 2B – Prior Art

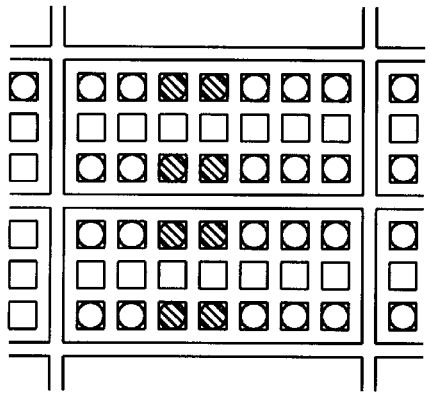
FIG. 3A – Prior Art
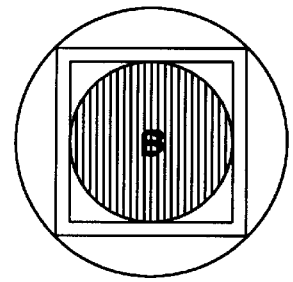
FIG. 3B – Prior Art
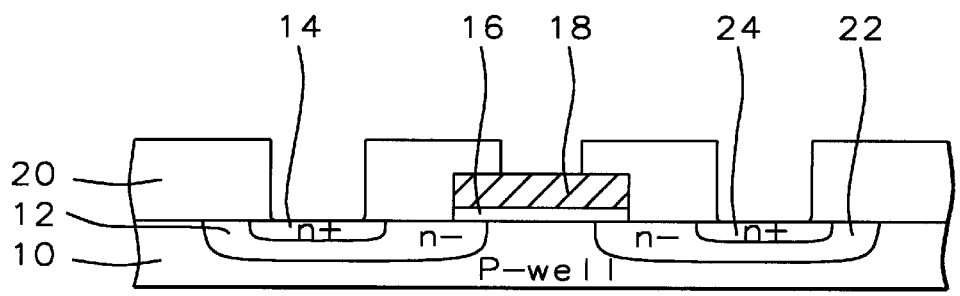
FIG. 4
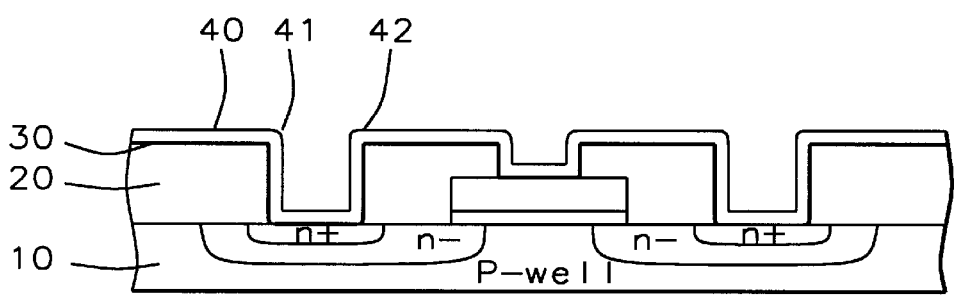
FIG. 5

5,874,355

METHOD TO PREVENT VOLCANE EFFECT IN TUNGSTEN PLUG DEPOSITION

This is a Continuation of application Ser. No. 08/579,512, filed Dec. 27, 1995. The parent non-provisional application is now abandoned.

BACKGROUND OF THE INVENTION (1) Field of the Invention

The present invention relates generally to semiconductors, and more specifically to a method of forming tungsten (W) interlevel connections (ILC), or "via plugs", between metallized conductive layers in integrated circuit (IC) chips without the detrimental "volcano effect" that causes craterous defects in chips. The method equally applies to "contact plugs" that are deposited over the drain-source-gate regions that form the basis of, for example, MOS (metal-oxide-semiconductor) devices.

(2) Description of the Related Art

Semiconductor devices arrive at their functional state only after having been "personalized" to do specific tasks in a prescribed manner. "Personalization" is achieved through metallization of defined regions in the semiconductor substrate. The process starts first by forming regions of field isolation. Then, in the MOS process, for example, a conductive gate is formed over a dielectric. The source and drain regions are heavily doped. interlevel dielectric layers are deposited over these areas to serve as electrical insulators. Subsequently, holes are opened (e.g., etched) in the interlevel dielectric whereby metal deposited later into these holes form "contact-plugs" which contact the source, drain and gate regions. Depending upon the levels of integration of the IC chip, one or more metal layers with appropriate circuitized patterns or "personalization" are next deposited alternately with interlevel dielectric layers. Connections between the metal layers is provided through "via-plugs." In the highly dense, submicron integrated circuit devices, where small feature sizes are desired, 3 or 4 levels of interconnection metallization may be required.

At the same time that small size features are used to keep the device density as high as possible, the via density is also kept high by stacking the holes one on top of the other as shown in FIG. 1(A). This is more readily possible if the sidewalls of the holes are vertical, for otherwise, with tapered sidewalls, the vias must be staggered as shown in FIG. 1(B). (In both FIGS. 1(A) and 1(B), regions 10, 12, are first and second level metal layers, respectively, and regions 14, 16 are the first and second level insulators, and 18, 20 are the first and second level vias through the respective insulators.) The resulting increase in pattern size results in an area penalty that can significantly decrease packing density. The slug of metal deposited into these vertical holes are referred to as "plugs".

In general, the integrity of the metallization on each level, and in particular, that of the metal plugs—which we distinguish as "contact-plugs" those over the source-gate-drain, and "via-plugs" between the metal layers themselves—in the openings in the interlevel dielectric, is very important in the manufacture of IC chips. When metal is deposited on a surface, what is wanted is a solid, smooth arid continuous interface between the metal surface and the other contacting surface. On the contrary, what is usually found, under certain circumstances, are rugged interfaces with spikes of one material protruding into the other, and vice versa. Traditionally, this "spiking" and metal diffusion into the semiconductor substrate have been the two most encountered problems during metallization. Still another problem that has recently been encountered is the "volcano effect"—which will be described later—stemming from the reaction $WF_6+Ti \rightarrow TiF_x+$by-products in the metallization of tungsten (W) "contact" and "via" plugs.

Usually, barrier layers are used to circumvent the spiking type problems as described in the U.S. Pat. No. 5,232,871: Contact spiking can occur in device fabrication when the device is exposed to high temperatures. It is a phenomenon that is related to solid solubilities. When two dissimilar materials come in contact with each other, there will be an equilibrium concentration of one of the materials into the other material. As an example, when pure silicon and pure aluminum come into contact, the interface at the touching surfaces are initially smooth. During high temperature processing such a an alloy cycle, because aluminum can support larger amounts of silicon, the silicon can move into the metal and leave a void behind. Conversely, the metal may diffuse through a heavily doped junction and cause increased leakage current or a short circuit to the substrate. The result of both processes (silicon going to the aluminum and aluminum going into the silicon) is an aluminum-silicon interface that is not smooth, but spiky. The process is referred to as spiking. Ideally, barrier layers keep spiking and dissolution of one material into another from occurring. In reality, that may not be the case.

Spiking and metal diffusion mechanisms may be minimized by using silicon containing aluminum alloys such as Al-1%Si or using barrier materials such as titanium-tungsten (Ti-W). In fact, sputtered titanium nitride (TiN) is used as a barrier layer. However, TiN has problems of its own. Firstly, as it is being sputtered on a surface in a sputtering chamber, it forms itself as columnar structures with gaps in between the columns. The gaps are referred to as grain boundaries, and during metallization, they allow metal to migrate through them to reach the underlying surface. If the underlying surface is the substrate, then spike formation and metal diffusion can occur into the drain-source-gate regions, which as mentioned before, are not desirable.

There are a number of solutions that are proposed in prior art to solve the spiking and diffusion problems. In one metallization process, an attempt is made to fill the gaps in between the columns, or the grain boundaries in the TiN barrier by "stuffing" them with oxygen ($O_2$) gas molecules ("stuffed barriers" are discussed in the book "Silicon Processing for the VLSI Era" by S. Wolf, Lattice Press, Sunset Beach, Calif., 1990, Vol. 2, p. 123) prior to the deposition of the metal so that the metal would not be able to pass by these molecules and migrate to the underlying substrate. However, it is found that this "oxygen stuffing" is not very effective when done at atmospheric room temperature because the gas adsorption process then is neither adequate nor reliable. Another proposal goes one step further where a atmospheric but high temperature process or plasma enhanced reaction process is used. Still the results are not totally effective. (U.S. Pat. No. 5,232,871).

Still another prior art employs still higher temperatures to improve the TiN integrity. As stated in U.S. Pat. No. 5,232,871, after the substrate has been first coated with TiN, the substrate is processed in a Rapid Thermal Annealer (RTA) at about 600° C. to 800° C. in nitrogen for 30 to 90 seconds. The high temperature causes the reaction of nitride and nitrogen to form significantly more TiN than when exposed to atmospheric air at room temperature. The barrier layer becomes sealed preventing spike formation or metal diffusion into the substrate. Subsequently, metals may be deposited without having to worry about the integrity of the barrier layer. Unfortunately, RTA's, while solving one set of problems, introduce another set of problems down-stream the production line. One serious problem is the warping of the substrates caused by high temperatures and the resulting high temperature gradients thereof that can be imposed on the surface of the substrates unless the equipment is adjusted frequently. If the substrate is warped, lithographic patterns cannot be aligned over the entire surface of the substrate which is an essential operation in the manufacture of IC devices. Furthermore, RTA's cannot be used after metal processing since the metal will melt and lines will short. Additionally, RTA's have been plagued by numerous equipment failures, and are usually limited in their use as research tools.

As seen above, the prior art has been focused on trying to seal the grain boundaries—that is, the spaces between the columnar structures of the barrier layer—so as to be able to stop the migration of the subsequently deposited metal into those spaces as a measure to prevent the spiking and metal diffusion problems at the interfaces. There is an additional problem which the prior art does not address. That is the problem of the "volcano effect".

Volcano effect is caused by the eruption of certain substances that have entered into the grain boundaries of the barrier layer during metallization. These substances may be process contaminants, etchant compounds harbored in the sidewalls of the holes in the interlevel dielectric, or other by-products of the metallization process. In the tungsten metallization, the following reaction takes place:

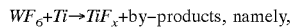

$WF_6+Ti \rightarrow TiF_x$+by–products, namely, the tungsten fluoride ($WF_6$) reacts with the titanium (Ti) film layer to yield titanium fluoride (TiFx) plus some other by-products. It is the titanium fluoride (TiFx)—which can easily slip by even if the grain boundaries have been "stuffed" with oxygen molecules—that erupt during metallization and result in craterous defects as seen on a substrate shown in FIG. 2A in the magnified plan view of one of the circular vias under a rectangularly shaped pad is also shown in FIG. 2B.

SUMMARY OF THE INVENTION

It is therefore an object of this invention to eliminate "volcano effect" and thereby provide a simple method for improving the integrity of tungsten plug deposition both over the contact regions and in the vias that connect the various metal layers in a semiconductor substrate. This also improves the contact resistance ($R_c$) of the "plugs."

It is a further object of this invention to improve the TiN barrier structures in the said substrate.

It is still another object of the invention to shorten production time, increase thruput, reduce exposure to external contaminants, and provide savings in operational handling and cost.

These objectives are accomplished by first sputtering a thin film of titanium which will later serve as a source for enhancing the titanium nitride barrier layer. Then, titanium nitride is sputtered over the first titanium layer to serve as the barrier layer for a subsequent metal deposition. At this point, the substrate thusly prepared, is introduced into a tungsten chamber where the substrate is exposed in-situ to nitrogen ($N_2$) plasma of a specific recipe. Only nitrogen plasma is used to convert more of nitride in the first layer to more of TiN to fill up the gaps in between the grain boundaries and seal the surface. Thus, the subsequently deposited metal will not migrate through the TiN barrier layer. Furthermore, the "filling" takes place "bottoms up" from the titanium source layer so as to flush out any of the residues and contaminants, such as the etchant by-products from the earlier hole forming and cleaning processes. Thus, the eruption of unwanted products or the "volcano effect" will not take place. With the substrate having just been exposed to nitrogen plasma as described above, and the TiN barrier layer also been annealed at an appropriate temperature, tungsten metal is deposited next, still in the same chamber as the plasma. As the barrier layer is properly sealed and annealed by the plasma at the same time, it is no concern now that the by-products of the reaction $WF_6+Ti \rightarrow TiF_x$+by–products will be trapped in the wells of the "contact plugs" or in the side-walls of the "via-plugs" to cause any "volcano effect," as seen in the magnified plan view of one of the circular vias under a rectangularly shaped pad shown in FIG. 3A. A magnified plan view of one of the circular vias under a rectangularly shaped pad is also shown in FIG. 3B. Furthermore, it is clear that the remaining titanium layer now integrated with the tungsten plug will improve the overall contact resistance ($R_c$) of the plugs.

It will be appreciated that because of the combination of the said two steps(nitrogen plasma in tungsten deposition chamber) shortens production time, increases thruput, reduces exposure to external contaminants, and provides savings in operational handling and cost. The fact that conventional RTA's are not used eliminates the attendant problems of substrate warpage, contamination and thruput, as mentioned earlier.

BRIEF DESCRIPTION OF THE DRAWINGS

FIG. 1(A) is a cross-sectional drawing of the prior art showing a vertically sidewalled opening.

FIG. 1(B) is a cross-sectional drawing of the prior art showing a walled opening.

FIG. 2A is a top view showing the "volcano effect" of the prior art on a tungsten-metallized substrate not exposed to $N_2$ plasma and annealing.

FIG. 2(B) is a magnified view of one of the circular vias under a rectangularly shaped pad of FIG. 2A.

FIG. 3A is a top view of a device formed by the method of the invention showing no "volcano effect" on a tungsten-metallized substrate exposed to $N_2$ plasma and annealing.

FIG. 3B is a magnified view of one of the circular vias under a rectangularly shaped pad of FIG. 3A.

FIG. 4 is a cross-sectional view of a semiconductor substrate following the formation of contact openings.

FIG. 5 is a cross-sectional view of the same semiconductor substrate after layers of Ti and TiN have been deposited.

DESCRIPTION OF THE PREFERRED EMBODIMENTS

Figure 6:
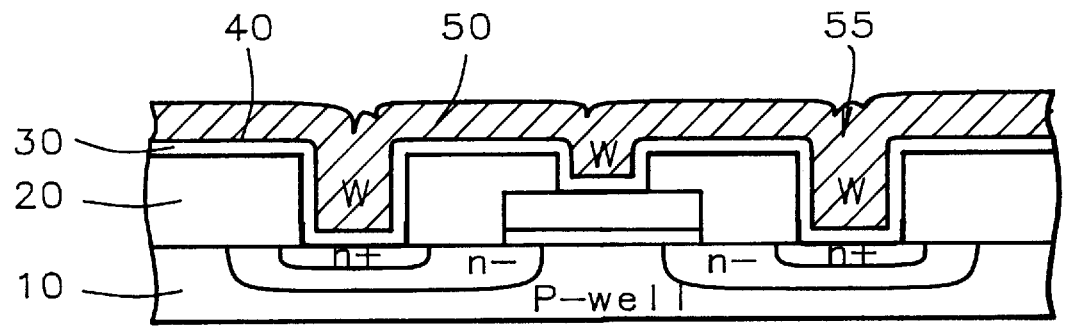
FIG. 6 is a cross-sectional view of a semiconductor substrate where the tungsten "contact-plugs" over drain-source-gate regions are depicted.

Referring now to FIG. 4, a substrate 10 is shown along with source regions 12 and 14, gate, 18, and drain regions 22 and 24, and gate oxide 16 for a MOS device. These are formed by methods well known in the art and as they are not significant to the invention, will not be described in detail here. It is sufficient to note that the substrate in FIG. 4 has been subjected to many different process steps including field isolation, gate definition, source/drain implants, inter-level dielectrics, and contact definition. Region 20 in FIG. 4 is the interlevel dielectric and is a boron and phosphorous doped film which is deposited by the decomposition of tetraethyl orthosilicates (BP-TEOS). as used in the invention. The actual steps used are not critical to the spirit of this invention. Furthermore, it should be noted that the procedures of the invention disclosed herein pertain to any device where titanium-nitride barrier layers and metallization thereafter are applied.

FIG. 5 is a cross-sectional view after titanium (Ti) and titanium nitride (TiN) deposition. Regions 30 and 40 are Ti and TiN layers, respectively. The films are deposited using reactive sputtering processes. The sputtering parameters are:

TABLE I

| Parameters: | Ti deposition | TiN deposition |
| --- | --- | --- |
| System pressure (mT) | 2–2.5 | 3.5–4 |
| Sputter environ. (sccm) | Ar 36 | $N_2$:100, Ar:50 |
| DC power (W) | 3000 | 6500 |

It should be noted in this invention that a titanium film is expressly deposited for several reasons: most importantly, the film provides good step coverage over the corners of the vertical sidewalled holes; the film improves the adhesion of tungsten to $SiO_2$ and in so doing consumes the thin $SiO_2$ layer which in turn improves the contact resistance; the film protects the tungsten from corrosion by forming a thin layer of titanium oxide on the surface, making tungsten an even better diffusion layer.

As is seen in the present invention, the advantages of depositing a titanium film as described above is preserved without the deleterious volcano effects. For this purpose, the sputter-deposition process is carried out in an argon-nitrogen (Ar-$N_2$) environment so that nitrogen is incorporated in the Ti:W film. The nitrogen improves the barrier properties of the film by "stuffing" the grain boundaries, thereby substantially reducing the rate of interdiffusion. More importantly, it decreases the reactivity of the titanium in the films through the formation of TiN. Aid most importantly, Ti and TiN are subjected to in-situ $N_2$-plasma in such a manner so as to prevent "volcano effect" as was described in the summary section.

The critical parameters in the sputtering process are the system pressure of 2–2.5 millitorr (mT) for Ti deposition, and 3.5–4 mT for TiN deposition. The sputtering environment requires 36 standard cubic centimeter (sccm) of argon (Ar) for Ti and 50 sccm of Ar plus 100 sccm of $N_2$ for TiN deposition. It will be noted that the first layer of titanium is also critical to the invention as it is the source for additional barrier material needed to fill the gaps in the grain boundaries subsequent to the TiN deposition. Its preferred thickness is between about 400 to 600 micrometers.

Next, in a key step of the invention, the integrity of the TiN is enhanced by exposing it to nitrogen ($N_2$) plasma in a tungsten deposition chamber. The preferred parameters in this environment are:

TABLE II

| Parameters: | $N_2$-plasma environment in tungsten chamber |
| --- | --- |
| System temperature | 400–480° C. |
| System pressure (mT) | 300–600 |
| Plasma environment | $N_2$:200–300 sccm |
| RF power (watts) | 80–120 |
| Time (sec) | 90–120 | a) The preferred temperature is about 425° C. At higher temperatures, such as in RTA's where the ambient temperature may be as high as 650° C., "volcano effect" is encountered very readily in the via-plug process. This is primarily because of the weak spots found at the corners (41) and shoulders (42) of the holes due to the relatively poor step coverage as well as the higher longitudinal stresses that are formed in Ti and TiN films at those locations. Higher temperatures compound the delitirious effects by expanding the aforesaid gaseous substances and forcing them out to create craterous defects.

b) The optimal condition for the $N_2$ plasma requires a system pressure in the range of 0.3 to 0.6 torrs. Under these relatively higher pressure conditions than is conventionally used, nitrogen is more readily "stuffed" and "packed" into the grain boundaries of TiN barrier.

c) The plasma environment is comprised of about 200–300 sccm of nitrogen. Nitrogen aids in the production of titanium nitride in the barrier layer. Also, it is the source to "stuff" nitrogen into the grain boundaries in order to block metal migration paths.

d) The total time (with concomitant annealing) in the plasma chamber is about 90–120 seconds. Comparing this with the usual times of more than 150 seconds required in RTA's, this invention improves thruput by about thirty percent (30%).

Figure 7:
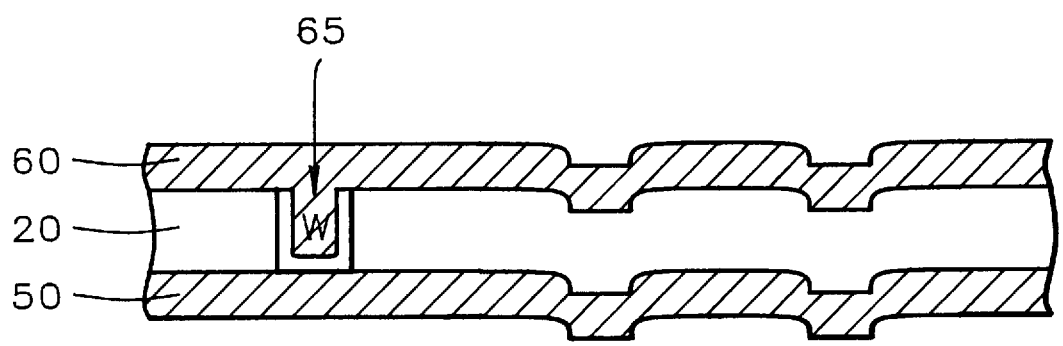
FIG. 7 is a cross-sectional view of a semiconductor substrate where the tungsten "via-plugs" between the metallized layers are depicted.

FIG. 6 is a cross-sectional view of a semiconductor substrate where the tungsten "contact-plugs" over drain-source-gate regions are depicted. Region 55 represents such a plug. FIG. 7 is still another cross-sectional view of a semiconductor substrate where the tungsten interstitial "via-plugs" between the metallized layers are depicted. Region 65 represents such a via-plug. The processing steps are equally applicable in the production of both the tungsten "contact-plugs," and the "via-plugs."

While the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method of forming tungsten contact plugs without volcano effect on a semiconductor substrate comprising the steps of:

providing a semiconductor substrate having an insulating layer with contact holes formed therein;

placing said semiconductor substrate in a tungsten deposition chamber;

depositing a titanium layer over said semiconductor substrate in said tungsten deposition chamber;

depositing a titanium nitride layer having open columnar structures in between grain boundaries of said titanium nitride layer over said titanium layer in said tungsten deposition chamber;

subjecting said titanium nitride layer to an in-situ plasma in said tungsten deposition chamber for about 90 to 120 seconds, wherein the temperature, pressure and power of said plasma are, respectively, between about 400° C. to 480° C., 0.3 torr to 0.6 torr and 80 watts to 120 watts;

reacting said plasma with said titanium layer through the overlying said titanium nitride layer to form further titanium nitride so as to fill and seal said open columnar structures between said grain boundaries of said titanium nitride layer; and depositing at least one layer of tungsten metal over said titanium nitride layer to form said contact plugs in said tungsten deposition chamber.

2. The method of claim 1, wherein the vertical walls of said contact holes have an included angle between about 85 to 90 degrees.

3. The method of claim 1, wherein said plasma is nitrogen plasma.

4. A method of forming tungsten via plugs without volcano effect on a semiconductor substrate comprising the steps of:

providing a semiconductor substrate having an insulating layer with via holes formed therein;

placing said semiconductor substrate in a tungsten deposition chamber;

depositing a titanium layer over said semiconductor substrate in said tungsten deposition chamber;

depositing a titanium nitride layer having open columnar structures in between grain boundaries of said titanium nitride layer over said titanium layer in said tungsten deposition chamber;

subjecting said titanium nitride layer to an in-situ plasma in said tungsten deposition chamber for about 90 to 120 seconds, wherein the temperature, pressure and power of said plasma are, respectively, between about 400° C. to 480° C., 0.3 torr to 0.6 torr and 80 watts to 120 watts;

reacting said plasma with said titanium layer through the overlying said titanium nitride layer to form further titanium nitride so as to fill and seal said open columnar structures between said grain boundaries of said titanium nitride layer; and depositing at least one layer of tungsten metal over said titanium nitride layer to form said via plugs in said tungsten deposition chamber.

5. The method of claim 4, wherein the vertical walls of said via holes have an included angle between about 85 to 90 degrees.

6. The method of claim 4, wherein said plasma is nitrogen plasma.

* * * * *

UNITED STATES PATENT AND TRADEMARK OFFICE
CERTIFICATE OF CORRECTION

PATENT NO. : 5,874,355
DATED : 02/23/99
INVENTOR(S) : Ji-Chung Huang, Je Wang, Ying-Shih Huang It is certified that error appears in the above-indentified patent and that said Letters Patent is hereby corrected as shown below:

On the title page, item [54], and column 1, line 3, delete "VOLCANE", and replace with --VOLCANO--.

Signed and Sealed this

Twenty-eighth Day of September, 1999

Attest:

Q. TODD DICKINSON

Attesting Officer     Acting Commissioner of Patents and Trademarks